United States Patent [19]

Shimizu et al.

[11] Patent Number: 5,214,991
[45] Date of Patent: Jun. 1, 1993

[54] PUNCHING APPARATUS

[75] Inventors: Izumi Shimizu, Hitachiota; Shinya Yoshida, Mobara; Kiyoharu Nakajima, Yokohama, all of Japan

[73] Assignees: Hitachi, Ltd.; Hitachi Seiko, Ltd., both of Tokyo, Japan

[21] Appl. No.: 745,435

[22] Filed: Aug. 15, 1991

[30] Foreign Application Priority Data

Aug. 30, 1990 [JP] Japan .................. 2-229319
Sep. 6, 1990 [JP] Japan .................. 2-236706

[51] Int. Cl.⁵ ........................ B26D 7/18; B26F 1/04
[52] U.S. Cl. .............................. 83/168; 83/100; 83/169; 83/687; 83/821; 83/824
[58] Field of Search ............ 83/98, 100, 168, 169, 83/686, 694, 824, 30, 145, 146, 825, 660, 140, 684, 821, 687

[56] References Cited

U.S. PATENT DOCUMENTS

| | | | |
|---|---|---|---|
| 274,957 | 4/1883 | McMurtry | 83/169 X |
| 390,925 | 10/1888 | Warner | 83/169 X |
| 3,125,917 | 3/1964 | Smeets | 83/694 X |
| 3,554,065 | 1/1971 | Kunz | 83/685 X |
| 3,800,643 | 4/1974 | Scott et al. | 83/169 X |
| 4,104,941 | 8/1978 | Krueger | 83/133 |
| 4,312,256 | 1/1982 | Herzog et al. | 83/694 |
| 4,862,782 | 9/1989 | Ernst | 83/140 X |
| 4,872,381 | 10/1989 | Stroms | 83/100 X |
| 4,989,484 | 2/1991 | Johnson et al. | 83/140 |
| 5,056,392 | 10/1991 | Johnson et al. | 83/169 X |
| 5,131,303 | 7/1992 | Wilson et al. | 83/140 |

FOREIGN PATENT DOCUMENTS

| | | | |
|---|---|---|---|
| 560235 | 7/1958 | Canada | 83/169 |
| 481766 | 8/1929 | Fed. Rep. of Germany | 83/169 |
| 1-171800 | 7/1989 | Japan . | |
| 2-059299 | 2/1990 | Japan . | |
| 322227 | 2/1972 | U.S.S.R. | 83/169 |

Primary Examiner—Frank T. Yost
Assistant Examiner—Clark F. Dexter
Attorney, Agent, or Firm—Fay, Sharpe, Beall, Fagan, Minnich & McKee

[57] ABSTRACT

A punching apparatus used for high speed punching of holes in a workpiece, such as a ceramic green sheet, for use as a printed-circuit board. Upper and lower die blocks, stationary relative to each other, are provided, with punch pins fixed in two dimensions by multiple guides. A fluid passage is provided within the lower die block for providing gaseous lubrication and cleaning of the punch pin while in operation.

23 Claims, 8 Drawing Sheets

PUNCHING APPARATUS

BACKGROUND OF THE INVENTION

1. Field of the Invention

This invention relates to a punching apparatus for making or forming holes, and more particularly, to a punching apparatus for making holes in a workpiece or matter to be worked such as ceramic green sheet (referred to simply as "green sheet", hereinafter).

2. Background Art

It is generally known to use a multilayer printed-circuit board of ceramic as a substrate of a semiconductor integrated-circuit device, for example, used in a large-scale computer and the like. This kind of ceramic substrate or board is generally manufactured in such a manner that a basic substrate called green sheet, which is formed by a sheet-like sinter of alumina, is first formed therein with through holes by a punching apparatus and, then, a conductive paste of molybdenum (Mo) or tungsten (W) is printed on the surface of the substrate in the fixed pattern and, at the same time, filled in the inner walls of the through holes, and thereafter, a fixed number of these substrates are laminated and subjected to the sintering at a time.

By the way, the performance of the multilayer printed-circuit board or substrate depends on whether or not the through holes serving to electrically connect the printed circuit conductor layers of the multilayer printed-circuit ceramic substrate to each other are formed in correct positions with correct size and whether or not the through holes are formed without damaging the substrate around the through holes. For this reason, in case of manufacturing the multilayer printed-circuit ceramic substrate, it is an important manufacturing process that the through holes are formed in correct positions without damaging the substrate around the through holes.

Examples of the conventional punching apparatus for making through hole include the punching apparatus disclosed in Japanese Patent Unexamined Publication Nos. 1-171800 and 2-59299. This kind of punching apparatus comprises a lower die block having a flat upper surface on which a green sheet as a sheet-like matter to be worked is to be put and a plurality of first penetrating holes each extending from the upper surface perpendicularly thereto and located in a position where a hole is to be made in the matter to be worked, an upper die block having a lower surface arranged close to the upper surface of the lower die block so as to be opposed to the upper surface thereof and a plurality of second penetrating holes each extending from the lower surface perpendicularly thereto and located in a position opposite to an opening at the upper end of the first penetrating hole, and a plurality of punch pins each having a shaft portion and a cutting edge portion located at the lower end of the shaft portion and inserted in the second penetrating hole movably along the second penetrating hole so as to project the cutting edge portion out from the second penetrating hole of the upper die block, in which punching apparatus the upper die block has a bearing portion in the axial central part of each second penetrating hole for serving to support the shaft portion of the punch pin for free sliding movement along the second penetrating hole.

The present inventors use a punching apparatus having a working section of the construction shown in FIG. 10 in one of the inventors' companies, which apparatus was obtained by improving the punching apparatus disclosed in the above publications and, hence, is not known in public.

In the punching apparatus of FIG. 10, a green sheet 201 to be subjected to punching is put on a die base 202 of a lower die assembly 250 of the punching apparatus, and a die 203 is fixed in a hole 251 of the die base 202.

An upper die body 260 of the punching apparatus comprises a base plate 204 as an upper plate, a punch pin support body 205 fixed to the underside of the base plate 204, and a stripper plate 206 as a lower plate fixed to the underside of the punch pin support body 205.

A sleeve 207 is inserted in a penetrating hole 261 of the punch pin support body 205, and a ball guide 208 is inserted in the sleeve 207.

In a penetrating hole 262 of the base plate 204, a lower spring shoe 209 is inserted so as to be brought into contact with the upper surface of the punch pin support body 205 and, further, a spring 210 is inserted so as to be brought into contact with the upper surface of the spring shoe 209.

Further, in the penetrating hole 262 of the base plate 204, an upper spring shoe 211 is inserted so as to be brought into contact with the spring 210. A pin holder 213 formed with a flange 212 serving to come in contact with the spring shoe 211 is inserted in the ball guide 208 so as to be movable in vertical directions A and B.

A pin sleeve 214 having a flange 214a is put on and inserted in the upper portion of the pin holder 213. A punch pin 215 having a cutting edge 216 formed at one end thereof and extending through the base plate 204, the punch pin support body 205 and the stripper plate 206 is inserted in the pin sleeve 214.

The pin sleeve 214 is fixed to the punch pin 215 by means of a screw 219 screwed to one end of the pin sleeve 214 with its one end 217 being in contact with a large diameter upper end 218 of the punch pin 215. Upward movement of the pin holder 213 in the direction A is limited by a stopper plate 220 fixed to the base plate 204.

A set bush 221 is disposed in and fixed to the pin holder 213 at a lower portion thereof for serving to set a horizontal position of a shaft portion 263 of the punch pin 215 adjacent to the cutting edge 216.

In a working section 200 of the above construction, as the green sheet 201 is put on the die base 202 in position, a driving means which is not shown drives the punch pin 215 to move downward in the axial direction B under the guidance of the ball guide 208, thereby making a through hole 222 in the green sheet 201.

The diameter of the through hole 222 to be formed in this way has been reduced with the increase in mounting density and degree of integration, and now, it is required to make a through hole of diameter less than 0.2 mm. Further, increase of the number of through holes 222 causes the diameter of the cutting edge 216 of the punch pin 215 to be reduced as well, and a clearance C between the cutting edge 216 of the punch pin 215 and the die 203 has been required to be about 0.01 to 0.03 mm, more preferably as small as 0.001 mm, on one side.

In addition, in order to improve the efficiency of the punching operation, it is also required to increase the number of punch pins 215 to be disposed in the punching apparatus. For this reason, the punch pin 215 to be built in the punching apparatus 200 is needed to become further thin, and now, the outside diameter of the shaft portion thereof has become about 0.3 to 1 mm.

However, the above punching apparatus 200 according to the proposed technique is constructed with the intention of positioning the punch pin 215 with high accuracy so that the positioning structure thereof is very complicated. In consequence, the number of component parts is increased, resulting in a problem that it is difficult to obtain a high positional accuracy of the punch pin 215 under the influence of not only the error in making the penetrating hole 261 in the punch pin support body 205 but also the error in finishing the parts to be disposed in the hole 261 including the sleeve 207, the ball guide 208 and the pin holder 213 as well as the cumulative error appearing when the parts are combined.

Further, since it is necessary to provide a structure for stopping the leakage of the lubricating oil from the ball guide 208, such as a groove 223, in the stripper plate 206, the set bush 221 of the punch pin 215 is disposed at a distance from the upper surface 224 of the die base 202 and the cutting edge 216 of the punch pin 215, resulting in a disadvantage that it is very difficult to obtain a high positional accuracy of the cutting edge 216 of the punch pin 215.

On the other hand, complication of the above structure and increase of the number of parts make it difficult to dispose a large number of punch pins 215 in the upper die block at high density.

SUMMARY OF THE INVENTION

The present invention has been realized in view of the above-described points, and an object thereof is to provide a punching apparatus which is capable of solving at least part of the problems described above.

More specifically, a first object of the present invention is to provide a punching apparatus which is capable of positioning a punch pin with high accuracy by a relatively simple structure.

A second object of the present invention is to provide a punching apparatus which is capable of removing punching waste or chip from around a punch pin.

A third object of the present invention is to provide a punching apparatus which is capable of extending the lifetime of a punch pin and the like.

A fourth object of the present invention is to provide a punching apparatus which is capable of positioning a punch pin with high accuracy as well as of moving the punch pin at high speed.

According to the present invention, the first object can be achieved by a punching apparatus comprising: a lower die block having a flat upper surface on which a sheet-like matter to be worked is to be put and at least one first penetrating hole therein extending from the upper surface perpendicularly thereto and located in a position where a hole is to be made in the matter to be worked; an upper die block having a lower surface arranged close to the upper surface of the lower die block so as to be opposed to the upper surface and at least one second penetrating hole therein extending from the lower surface perpendicularly thereto and located in a position opposite to an opening at the upper end of the first penetrating hole; and at least one punch pin having a shaft portion and a cutting edge portion located at the lower end of the shaft portion and inserted in the second penetrating hole movably along the second penetrating hole so as to project the cutting edge portion out from the second penetrating hole of the upper die block, wherein the upper die block has upper and lower guide portions located in positions adjacent to upper and lower ends of the second penetrating hole for serving to support the shaft portion of the punch pin for free sliding movement along the second penetrating hole.

In this punching apparatus, since the upper die block, in particular, has the lower guide portion in the position adjacent to the lower end of the second penetrating hole for serving to support the shaft portion of the punch pin for free sliding movement along the second penetrating hole in addition to the upper guide member adjacent to the upper end of the second penetrating hole, the position of the shaft portion of the punch pin near the cutting edge is decided by the lower guide member located in the position adjacent to the lower end of the penetrating hole so that the positional accuracy of punching by the punch pin can be improved. Further, since the accuracy of positioning of the punch pin actually depends on the accuracy of finishing of the guide member(s), not only the positioning structure can be simplified but also the positional accuracy can be increased easily.

The second object can be achieved by the punching apparatus further comprising a fluid passage means through which a fluid is made to flow downward along the sliding surface over which the lower guide portion and the shaft portion of the punch pin slide against each other.

The fluid passage means can remove the punching waste or chip from the sliding surface over which the lower guide portion and the shaft portion of the punch pin slide against each other and from below the sliding surface, so that it is possible to move the punch pin smoothly for a long time. Further, the fluid forms a fluid bearing along the sliding surface so that the punch pin is enabled to move slidingly at high speed.

It is preferred that the fluid passage means comprises a fluid induction hole formed in the upper die block for serving to introduce the fluid into the second penetrating hole at an intermediate position between the upper and lower guide portions of the upper die block, and a lower fluid passage formed between the lower guide portion and the shaft portion of the punch pin along the sliding surface over which the lower guide portion and the shaft portion of the punch pin slide against each other. Such lower fluid passage can provide a flow of sufficient amount of fluid between the lower guide portion and the shaft portion of the punch pin with the gap between the sliding portions being kept minimum, so that it is possible to suppress the abrasion of the sliding portions of the lower guide portion and the shaft portion of the punch pin.

According to a preferred embodiment of the invention, the lower fluid passage is formed by a grooved portion formed in the lower guide portion along the sliding surface over which the shaft portion of the punch pin slides. This grooved portion is spiral in form, for example.

According to another preferred embodiment of the invention, the lower fluid passage is formed by a notched portion formed in the shaft portion of the punch pin along the sliding surface over which the lower guide portion slides. This notched portion comprises a grooved portion, for example, and is spiral in form, for example.

Further, according to a preferred embodiment of the invention, the lower guide portion is formed above the lower end of the second penetrating hole, and the upper die block further has a plenum chamber-forming means at the lower end of the second penetrating hole, the plenum chamber-forming means projecting radially inwardly so as to form a plenum chamber in a portion between the lower end of the lower guide portion and the lower end of the second penetrating hole and serving to throttle the flow of the fluid passing through the lower end of the second penetrating hole. The plenum chamber-forming means serves to speed up the fluid flow in the vicinity of the cutting edge, with the result that the punching waste or chip adhered to the cutting edge of the punch pin and the matter to be worked can be removed with much more reliability by this high speed fluid flow.

The third object can be achieved by a punching apparatus wherein the punch pin and the guide portion are formed by sinters of the same or different material or materials. It is preferred that the sinter is that of a hard alloy such as cemented carbide, or fine ceramics. In this case, the punch pin and the guide portion can be improved in wear-resistance, thereby making it possible to extend the lifetime.

The fourth object can be achieved by a punching apparatus comprising: a lower die block having a flat upper surface on which a sheet-like matter to be worked is to be put and at least one first penetrating hole extending from the upper surface perpendicularly thereto and located in a position where a hole is to be made in the matter to be worked; an upper die block having a lower surface arranged close to the upper surface of the lower die block so as to be opposed to the upper surface and at least one second penetrating hole extending from the lower surface perpendicularly thereto and located in a position opposite to an opening at the upper end of the first penetrating hole; at least one punch pin having a shaft portion of smaller diameter than the second penetrating hole and a cutting edge portion located at the lower end of the shaft portion, and inserted in the second penetrating hole movably along the second penetrating hole so as to project the cutting edge portion out from the second penetrating hole of the upper die block; and a high speed guide means disposed in an axial central part of the second penetrating hole between the second penetrating hole and the shaft portion of the punch pin for serving to guide the punch pin in such a manner that the punch pin can be moved at high speed along the second penetrating hole, wherein the upper die block has a guide portion in a position adjacent to the lower end of the second penetrating hole so as to guide the shaft portion of the punch pin for free sliding movement along the second penetrating hole.

According to this punching apparatus, the high speed guide means makes it possible to perform the punching at high speed, and the positional accuracy of the cutting edge of the punch pin be enhanced by the guide portion which serves to guide the shaft portion of the punch pin for free sliding movement along the second penetrating hole in the position adjacent to the lower end of the second penetrating hole, thereby making it possible to perform the punching with high positional accuracy. Further, since the positional accuracy of the punch pin actually depends on the accuracy of finishing of the guide bush, the number of parts concerned with the positioning is reduced and the structure for positioning is simplified, thereby easily increasing the positional accuracy of the punch pin, in other words, the positional accuracy of the through hole to be formed in the matter to be worked.

According to a preferred embodiment of the invention, the high speed guide means is a ball guide, and the upper die block comprises an upper die body having the second penetrating hole and a guide bush disposed between the second penetrating hole and the shaft portion of the punch pin in the position adjacent to the lower end of the second penetrating hole and fixed to the upper die block so as to constitute the guide portion, the guide bush serving to guide the shaft portion of the punch pin for free sliding movement along the second penetrating hole. Further, it is preferred that the upper die block comprises an upper die central portion having a central penetrating hole portion constituting the axial central part of the second penetrating hole, an upper plate portion having an upper penetrating hole portion constituting the axial upper part of the second penetrating hole and fixed to the upper die central portion, and a lower plate portion having a lower penetrating hole portion constituting the axial lower part of the second penetrating hole and fixed to the upper die central portion, the diameter of the lower penetrating hole portion being smaller than that of the central penetrating hole portion, and that the guide bush is inserted in and fixed to the lower penetrating hole portion. It is preferred that the upper end of the guide bush projects out upwards from the upper surface of the lower plate portion, so that there is no possibility that the lubricating oil of the ball guide is drained to be depleted even if it partially leaks out from the ball guide. In consequence, the ball guide can operate reliably for a long time and the punch pin can be moved at high speed for a long time. Further, it is possible to prevent the lubricating oil from flowing out and adhering onto the matter to be worked by the projecting upper end portion of the guide bush.

According to a preferred embodiment of the invention, the guide portion is formed above the lower end of the second penetrating hole, and the upper die block has a flange portion at the lower end of the second penetrating hole, the flange portion projecting radially inwardly of the second penetrating hole, and a tip hole portion defined by the radially inward end of the flange portion having a diameter smaller than that of the shaft portion of the punch pin but greater than that of the cutting edge portion. In consequence, when the punch pin is drawn out of the matter to be worked, the portion of the matter to be worked around the through hole just formed can be restrained from being lifted together with the punch pin and, hence, the portion of the matter to be worked around the hole can be restrained from being expanded and deformed.

According to an embodiment of the invention, the inside diameter of the guide bush is smaller than that of the ball guide. In consequence, it is possible to reduce the area of the sliding surface over which the shaft portion of the punch pin and the guide bush slide against each other when the punch pin is moved in the axial direction, so that the sliding resistance at the sliding surface can be made low, thereby making it possible to move the punch pin at high speed.

DETAILED DESCRIPTION OF THE INVENTION

Figure 1:
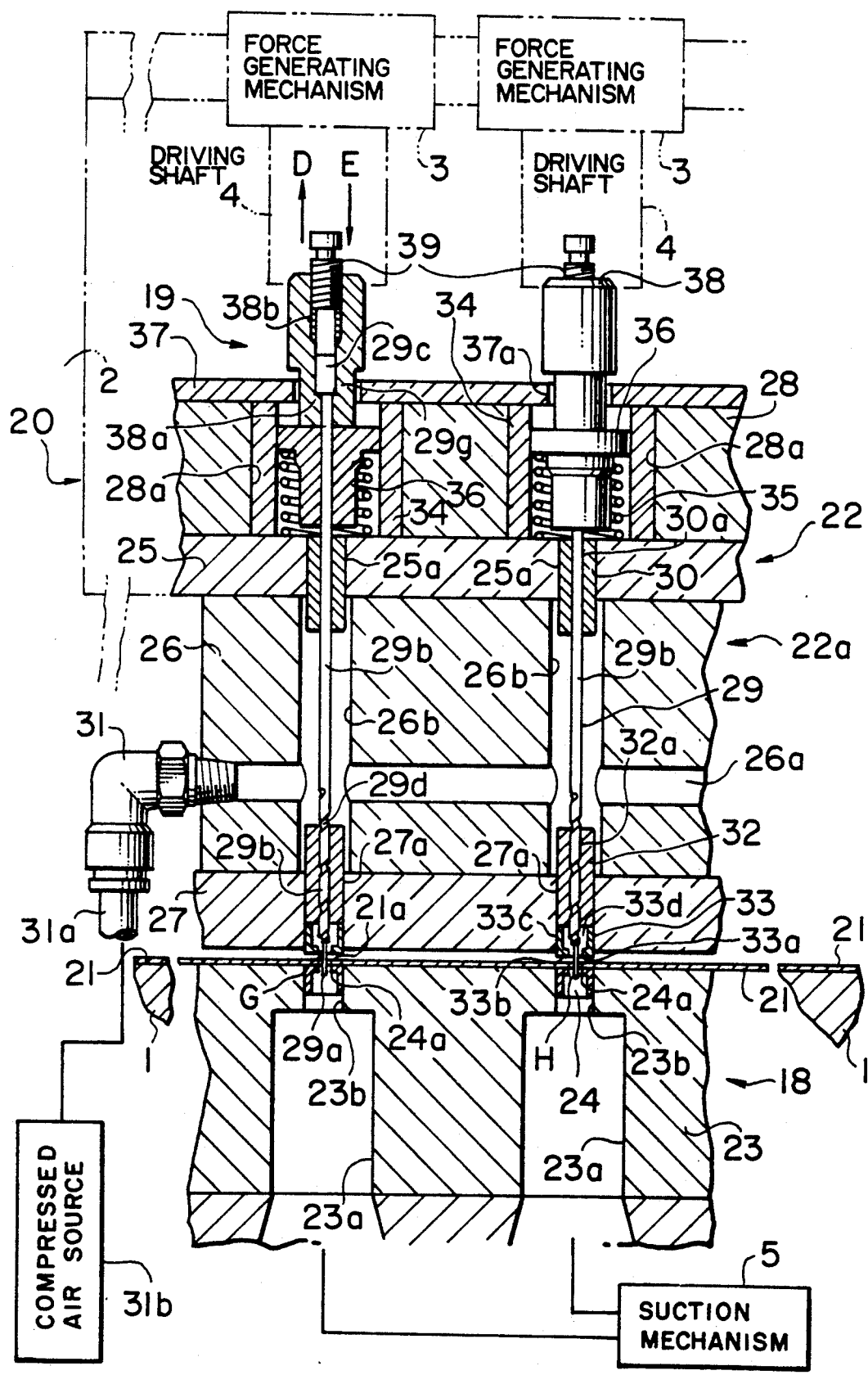
FIG. 1 is a sectional view of a punching apparatus according to a preferred embodiment of the present invention; 7

First, construction of a punching apparatus of this embodiment will be described with reference to FIG. 1. In this embodiment, a punching apparatus 20 serves to make holes in a green sheet 21 which is the workpiece or matter to be worked. The punching apparatus 20 comprises a lower die block 18 and an upper die block 22. The lower die block 18 has a lower die body or a die base 23 on which the green sheet 21 is to be put or positioned, and a plurality of dies 24 fixed into small-diameter portions 23b of penetrating holes 23a formed in the die base 23 at regular intervals. The upper die block 22 has an upper die body 22a which comprises a base plate 25 as an upper plate in which a plurality of penetrating holes 25a are formed at regular intervals in opposite relation to the penetrating holes 23a of the lower die body 23, a punch pin support 26 fixed to the lower surface of the base plate 25 and formed with a plurality of penetrating holes 26b communicating with the penetrating holes 25a of the base plate 25, a lower plate or a stripper plate 27 fixed to the lower surface of the punch pin support 26 and formed with a plurality of penetrating holes 27a communicating with the penetrating holes 26b of the support 26, and a plate 28 fixed to the upper surface of the base plate 25 and formed with a plurality of penetrating holes 28a communicating with the penetrating holes 25a of the base plate 25.

In the penetrating holes 25a, 26b, 27a and 28a formed respectively in the base plate 25, the punch pin support 26, the stripper plate 27 and the plate 28 of the upper die body 22a, a plurality of punch pins 29 which serve to make holes in the green sheet 21 are inserted in such a manner as to be movable up and down in the directions of arrows D and E. Each punch pin 29 has a small diameter cutting edge 29a serving as a punching tool, a shaft portion 29b constituting the body of the punch pin 29 and having a diameter larger than that of the cutting edge 29a, and a base portion 29c at the top having a diameter larger than that of the shaft portion 29b. In each of the dies 24 inserted and fixed into the small-diameter portions 23b of the penetrating holes 23a which are formed in the die base 23 of the lower die block 18 at the same regular intervals as the plurality of punch pins 29 to be disposed in the upper die block 22, a penetrating hole 24a of a little larger diameter than the cutting edge 29a of the punch pin 29 is formed.

In each of the penetrating holes 25a formed in the base plate 25 at the same regular intervals as the plurality of punch pins 29 like the die base 23, an upper guide bush (guide member) 30 is inserted and fixed, the upper guide bush 30 being formed with a penetrating hole 30a of substantially the same diameter as the shaft portion 29b of the punch pin 29.

The punch pin support 26 fixed to the lower surface of the base plate 25 is formed with, in addition to the plurality of penetrating holes 26b communicating with the penetrating holes 25a of the base plate 25, a fluid supply hole 26a which extends horizontally so as to meet at right angles to these penetrating holes 26b. The fluid supply hole 26a is connected through a joint 31 and a conduit 31a with a supply source 31b of compressed gas such as compressed air. The air filter (not shown) is also provided at the air source 31b. The compressed fluid may be nitrogen gas or the like so far as it is in gas phase. Incidentally, the supply hole 26a may intersect the vertical penetrating holes 26b obliquely in place of meeting at right angles. Further, the supply hole 26a may be provided for every penetrating hole 26b instead of intersecting the plurality of penetrating holes 26b. Moreover, the supply hole 26a may have a plurality of branch holes.

In each of the plurality of penetrating holes 27a formed in the stripper plate 27 fixed to the lower surface of the punch pin support 26 and communicating with the penetrating holes 25a and 26b of the base plate 25 and the punch pin support 26, a lower guide bush (guide member) 32 is inserted and fixed, the lower guide bush 32 being formed with a penetrating hole 32a of substantially the same diameter as the shaft portion 29b of the punch pin 29. Further, a bottomed cylindrical member 33 as plenum chamber- or stripper chamber-forming means is fixed at a cylindrical portion 33c thereof to the lower surface of each guide bush 32 so as to be opposed to the die 24, the bottomed cylindrical member 33 being formed with a penetrating hole 33a of a little larger diameter than the cutting edge 29a of the punch pin 29 in a flange portion 33b thereof near the die 24.

In each of the plurality of penetrating holes 28a formed in the plate 28 fixed to the upper surface of the base plate 25 and communicating with the penetrating holes 25a of the base plate 25, a bush 34 is inserted and fixed.

Further, within each bush 34, a spring 35 is inserted and a spring shoe 36 is put on the spring 35 so as to be movable within the bush 34. The upward movement of the spring shoe 36 is restricted by a stopper plate 37 formed with penetrating holes 37a communicating with the penetrating holes 28a of the plate 28 and fixed to the plate 28.

Figure 2:
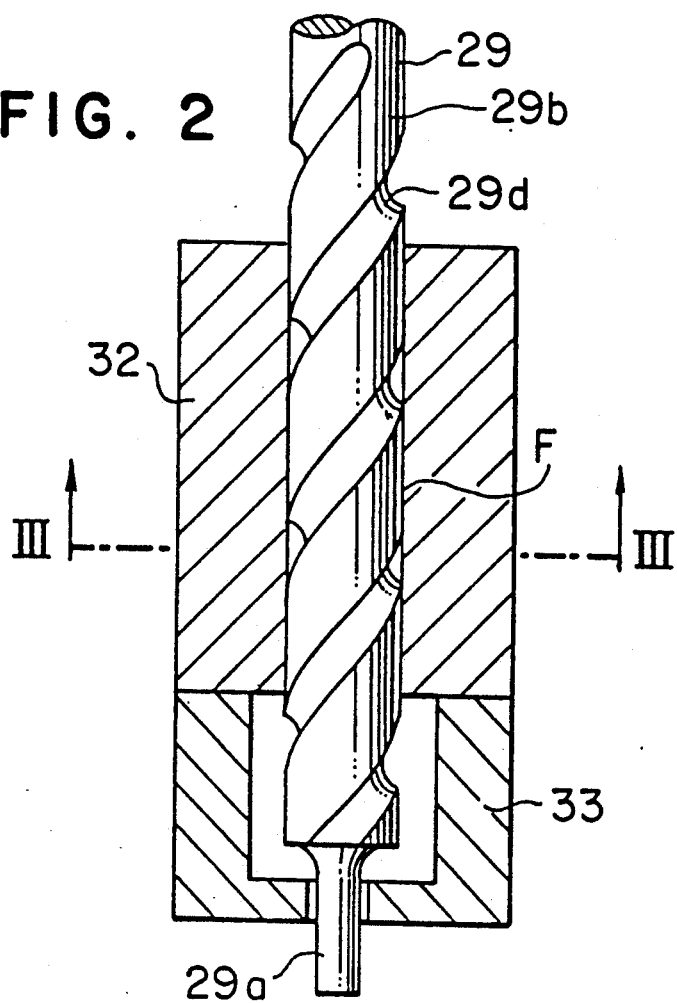
FIG. 2 is a sectional view of a punch pin and a guide member thereof which are used in the punching apparatus of FIG. 1.
Figure 3:
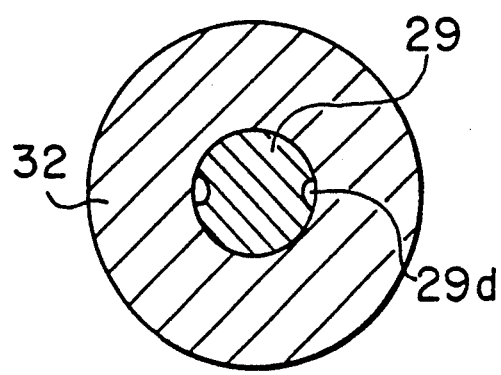
FIG. 3 is a sectional view taken along the line III—III of FIG. 2.
Figure 4A:
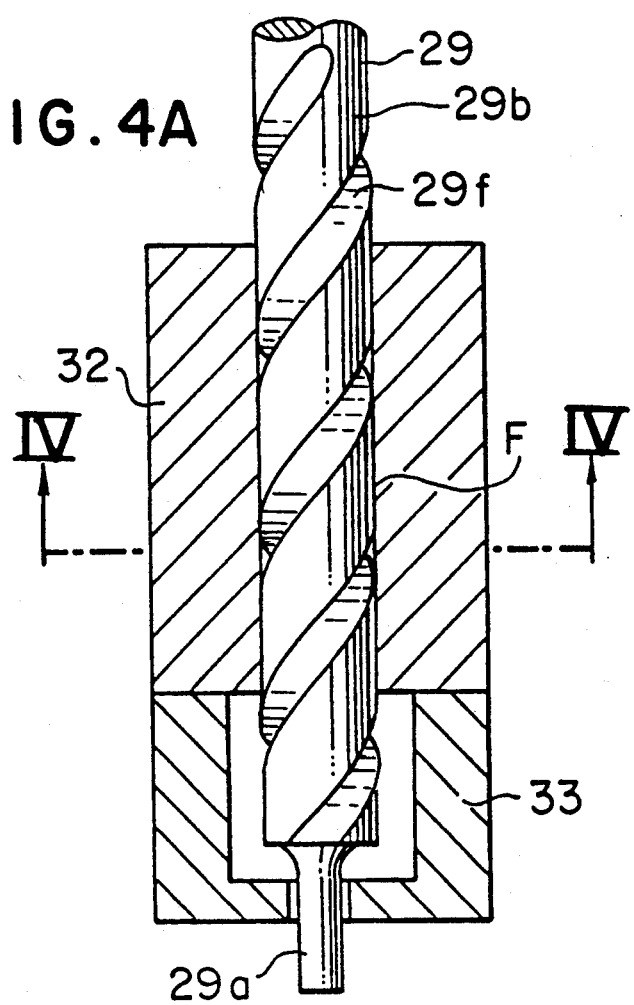
FIG. 4 is an illustration showing a modification of notched portions of the punch pin.
Figure 4:
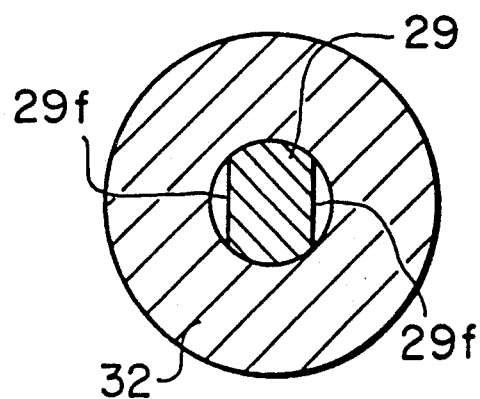

The punch pin 29 is formed in the end of the shaft portion 29b thereof adjacent to the cutting edge 29a with a single streak of spiral notch or groove 29d as shown in FIGS. 2 and 3. The groove 29d constitutes a lower fluid passage which is formed between the guide bush 32 and the shaft portion 29b of the punch pin 29 along the sliding surface F over which the lower guide bush 32 and the shaft portion 29b of the punch pin 29 slide against each other. The groove 29d may extend substantially straightly in the axial direction or may be curved and branch off complicatedly, in place of being spiral. Further, the groove 29d may consist of a plurality of streaks instead of a single streak. In addition, in forming the fluid passage in the pin 29, the fluid passage may be formed by another type of notch, in place of the groove, a flattened portion or a portion 29f the radius of curvature of which is greater than that of the peripheral surface of the shaft portion 29b of the pin 29 as shown in FIG. 4. It is preferred that the length of the groove 29d is so selected as to permit the compressed air to flow from top to bottom of the guide bush 32 through the groove 29d even when the punch pin 29 is located at any one of the upper position and the lower position. The sectional form of the groove 29d may be of any shape such as U-shape, V-shape or the like. The large-diameter portion 29c at the top end of the punch pin 29 is fixed by means of a screw 39 screwed in a thread portion 38b of a sleeve 38 in such a manner that a shoulder portion 29g is brought into contact with a stepped portion 38a of the sleeve 38.

The punch pin 29 is inserted such that the shaft portion 29b thereof extends downward through the pin sleeve 38, the spring shoe 36, and the guide bushes 30 and 32 in the mentioned order and that the cutting edge 29a thereof can penetrate the plenum chamber- or stripper chamber-forming member 33.

In this embodiment, the punch pin 29 and the guide bush 30, 32 are formed by sinters of cemented carbide(s) having a high effect of lubrication. The cutting edge 29a of the punch pin 29 is finished to have a diameter of about 0.13 mm so that it is possible to make through holes 21a of diameter about 0.15 mm in the green sheet 21 (for example, forty through holes 21a can be made at a time if forty punch pins 29 are disposed).

In the punching apparatus 20 of the above construction, the green sheet 21 is set at an accurate position on the lower die block 18 of the working section 19 by an X-Y table 1 which serves to move the green sheet 21 relative to the lower die block 18 in the directions X and Y for the purpose of deciding the position of the green sheet 21 in the horizontal plane. The lower die block 18, the base plate 25 and the like are fixed to a stationary frame 2. The punching apparatus 20 further comprises punching force generating mechanisms 3 such as electromagnetic coils supported by the frame 2, and driving shafts 4 each being made to move in the directions E and D by the force generating mechanism 3 and serving, when it is moved in the direction E, to push down the sleeve 38 connected with the punch pin 29 in the direction E so as to apply the punching force on the punch pin 29 in the direction E. These components may be those disclosed, for example, in Japanese Patent Unexamined Publication No. 1-171800. For example, the driving shaft 4 may be fixed to the sleeve 38.

Now, operation of this embodiment will be described.

First, the position of the green sheet 21 relative to the lower die block 18 is set by the X-Y table 1. Then, clean compressed air is supplied from the supply source 31b of compressed air to the supply hole or passage 26a and, at the same time, the air is sucked through the penetrating hole 23a of the die base 23 by means of a suction mechanism 5, so that the compressed air is made to flow about the punch pin 29 from the shaft portion 29b to the cutting edge 29a. In the state that the green sheet 21 has no through hole 21a formed therein, the compressed air coming from the side of the cutting edge 29a is made to flow along the upper surface of the green sheet 21.

Subsequently, the electromagnetic coils 3 are energized to serve to move downward the driving shafts 4 in the axial direction E. With the movement of the driving shafts 4, the punch pins 29 are moved in the direction E until the cutting edges 29a of the punch pins 29 penetrate through the green sheet 21 as shown in FIG. 1.

Then, the electromagnetic coils 3 are deenergized so that the punch pins 29 which have penetrated through the green sheet 21 are drawn out in the direction D due to the expanding forces of the compression springs 35 so as to be restored to their initial state. By repeating the above-described operation, it is possible to make a fixed number of through holes 21a in the green sheet 21 at fixed pitch.

In this case, the moment the punch pin 29 begins to be drawn out, the compressed air supplied to the supply hole 26a is fed into the plenum chamber 33d enclosed by the plenum chamber- or stripper chamber-forming member 33 through the groove 29d formed in the punch pin 29 (partly through the gap between the sliding surfaces of the guide bush 32 and the punch pin 29).

Since the hole 33a is small, the air pressure is increased in the plenum chamber or stripper chamber 33d so that the compressed air is made to flow out at high speed through a gap G between the peripheral wall of the hole 33a of the plenum chamber- or stripper chamber-forming member 33 and the cutting edge 29a of the punch pin 29 and pass through the hole 21a just formed in the green sheet 21 so as to be sucked toward the die base 23 through a gap H between the penetrating hole 24a of the die 24 and the cutting edge 29a of the punch pin 29 (through the hole 24a after the cutting edge 29a of the pin 29 is drawn out).

In this case, since the punching waste or chip of the green sheet 21 adhered to the cutting edge 29a of the punch pin 29 can be blown off by the compressed air flow and sucked toward the die base 23, it is possible to keep clean the cutting edge 29a of the punch pin 29.

Likewise, since the compressed air flows to the green sheet 21, the punching waste or chip stuck to the periphery of the through hole 21a just formed and the punching waste or chip fallen on the upper surface of the green sheet 21 can be blown off, thereby making it possible to keep clean the green sheet 21. Further, this air flow is capable of preventing the punching waste or chip from being introduced into the sliding portions between the guide bush 32 and the pin 29.

Further, movement, such as jump, of the green sheet 21 at the moment when the punch pin 29 is drawn out from the green sheet 21, that is, lift of the green sheet 21 due to friction between the peripheral wall of the hole 21a of the green sheet 21 and the cutting edge 29a of the punch pin 29, can be suppressed by the pressing force exerted by the compressed air flow directed to the surrounding of the punched portion 21a. In this case, by regulating the pressure of the compressed air to be supplied, jump of the green sheet 21 can be prevented without fail. Incidentally, the flange portion 33b of the chamber-forming member 33 also serves to restrain the green sheet 21 from jumping, thereby enabling the hole 21a of the sheet 21 to keep its desired small diameter.

Thus, according to the punching apparatus 20 of this embodiment, since the punch pin 29 which is formed with the groove 29d in the shaft portion 29b thereof at its end area adjacent to the cutting edge 29a, is inserted such that the shaft portion 29b extends through the sleeve 38, the spring shoe 36, and the guide bushes 30 and 32 and the cutting edge 29a penetrates the plenum chamber- or stripper chamber-forming member 33, the position of the punch pin 29 can be decided by the guide bushes 30, 32 serving as guide member for the punch pin 29, mainly by the lower guide bush 32 which is located in the vicinity of the lower end of the upper die body-penetrating hole constituted by the penetrating holes 25a, 26b and 27a. In consequence, the structure for positioning the punch pins 29 can be simplified and the punch pins 29 can be positioned easily with high accuracy. Further, simplification of the structure results in the reduction of the number of component parts, thereby making it possible to decrease the distance between adjacent punch pins 29 to be disposed (or increase the density of the punch pins 29 to be disposed), and hence, to increase the density of the holes 21a to be formed in the sheet 21. Incidentally, the chamber-forming member 33 can be dispensed with. In case of dispensing with this member 33, it is preferred that the lower bush 32 is disposed at the lower end of the hole 27a.

Since the compressed air is supplied along the punch pin 29, the punch pin 29 and the green sheet 21 can be kept clean and, hence, the cleaning of the green sheet 21 can be carried out easily. Incidentally, since the flow directed from the chamber 33d of the chamber-forming member 33 to the hole 33b thereof is convergent, the flow is concentrated around the cutting edge 29a of the pin 29 and the hole 21a of the sheet 21 so that the cleaning can be carried out effectively.

Further, since the compressed air is made to flow through the space between the guide bush 32 and the punch pin 29, a fluid bearing is formed on the sliding surfaces of the guide bush 32 and the punch pin 29. It is therefore possible to lessen the abrasion of the sliding portions as well as to suppress the frictional heat generated by the sliding motion, thereby suppressing the deformation of the parts due to the frictional heat. Incidentally, one of the suction mechanism 5 and the compressed air source 31b may be dispensed with. In case that the compressed air source 31b is dispensed with, the formation of the downward jet flow can be assured by the small hole 33a of the flange portion 33b of the chamber-forming member 33.

In addition, since the punch pin 29 and the guide bush 32 are formed by the sinters of cemented carbide(s), the wear-resistances of the punch pin 29 and the guide bush 32 can be improved, thereby extending the lifetime.

Figure 5:
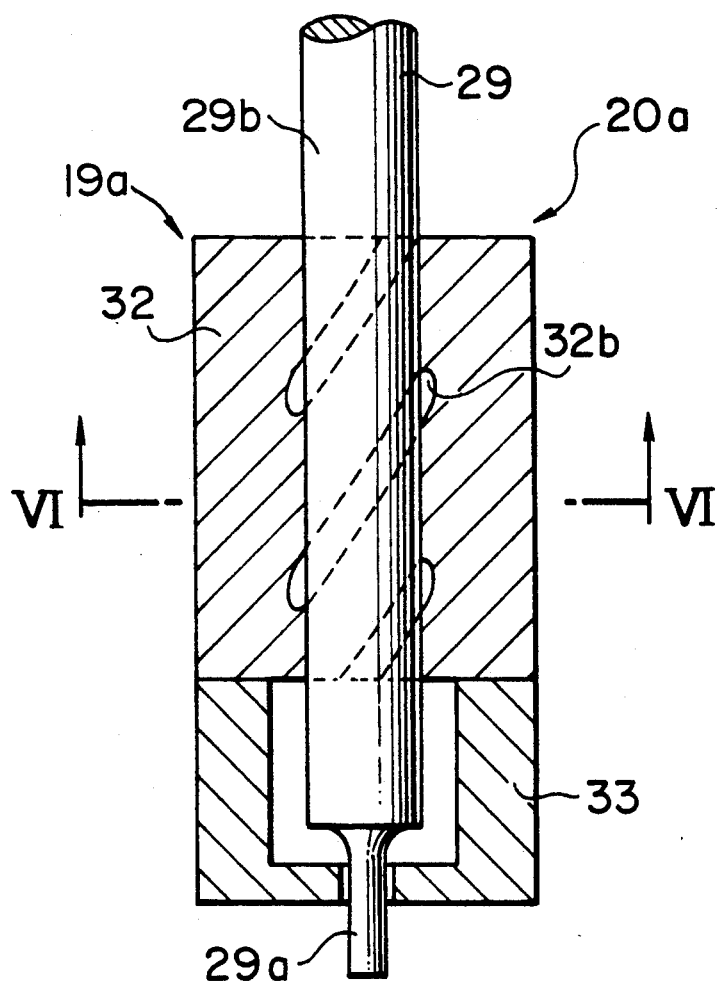
FIG. 5 is a sectional view similar to FIG. 2 but showing a punch pin and guide member thereof which are to be used in a punching apparatus according to a second preferred embodiment of the invention.
Figure 6:
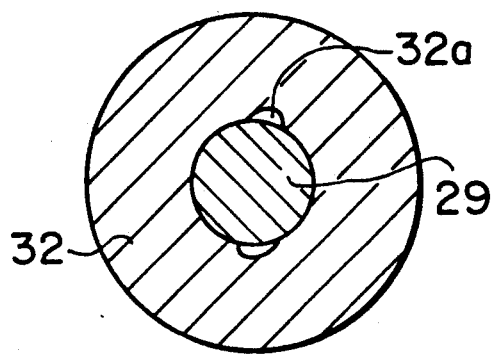
FIG. 6 is a sectional view taken along the line VI—VI of FIG. 5.

FIG. 5 is a sectional view showing a punch pin 29 and a guide member 32 thereof which are to be used in a punching apparatus according to another embodiment of the present invention, and FIG. 6 is a sectional view taken along the line VI—VI of FIG. 5.

The punching apparatus 20a of this embodiment has almost the same construction as that of the first embodiment and serves to make holes in the green sheet 21. A point of difference from the punching apparatus 20 of the first embodiment is that a single streak of spiral groove 32b is not formed in the peripheral surface of the pin 29 but in the inner peripheral surface 32a of the guide bush (guide member) 32 and the shaft portion 29b of the punch pin 29 is formed straight as shown in FIGS. 5 and 6.

It is noted that the groove 32b of the guide bush 32 can be modified like the above-described modification of the groove 29d of the punch pin 29.

Accordingly, in the working section 19a of the punching apparatus 20a of this embodiment as well, the compressed air supplied to the supply hole 26a is made to flow substantially along the pin 29 from the shaft portion 29b to the cutting edge 29a of the punch pin 29 through the groove 32b as the fluid passage means formed in the guide bush 32 (partly through the gap between the sliding surfaces of the guide bush 32 and the punch pin 29). In consequence, the punch pin 29 and the green sheet 21 can be kept clean and the abrasion of the sliding portions of the guide bush 32 and the punch pin 29 can be lessened, thereby enabling the punch pin 29 to move smoothly.

Further, similarly to the case of the first embodiment, since the position of the punch pin 29 can be decided by the guide bushes 30, 32, mainly by the guide bush 32, the structure for positioning the pins 29 can be simplified and the punch pins 29 can be positioned easily with high accuracy.

In the punching apparatus 20, 20a of the first and second embodiments, the punch pin 29 and the guide bushes 30, 32 have been described as being formed by the sinters of cemented carbide(s), and however, these may by formed by other sinter such as that of fine ceramics, for example. Meanwhile, it is desirable that the punch pin 29 and the guide bushes 30, 32 are formed by the sinters of the same material.

Moreover, forms of the punch pin 29 and the guide bush 32 are not limited to the ones shown in FIGS. 2 to 6 but can be modified in various forms such as the one which is formed with more than two streaks of spiral grooves or the one in which the groove is triangular in shape, for example.

In addition, the number of punch pins 29 is variable in accordance with the size of the green sheet 21, the punching pitch of the through hole 21a and the like.

Further, the punching apparatus 20, 20a of the above embodiments have been described in connection with the case that the compressed air as an example of the compressed gas is supplied to the hole 26a of the punch pin support 26, and however, it is possible to supply a cold gas, a hot gas heated to a desired temperature and the like, for example. In case of supplying the cold gas, it is possible to improve much more the cooling effect of the punching apparatus, particularly of the sliding portion of the punch pin 29. On the other hand, in case of supplying the hot gas, it is possible to maintain suitably the clearance between the sliding portions of the guide bush 32 and the punch pin 29 by making use of the differences in thermal expansion of the component parts.

The ceramic green sheet as the workpiece or matter to be worked can be replaced by other things such as flexible plastic printed-circuit board, steel plate or sheet, non-ferrous metal plate or sheet, plate-like lamination of plastic sheet(s) and metallic sheet(s), and the like.

As described above, according to the punching apparatus 20, 20a, it is possible to improve the accuracy of positioning as well as to reduce the sliding resistance of the punch pin, and therefore, it is possible to make holes at high speed with high accuracy.

Figure 7:
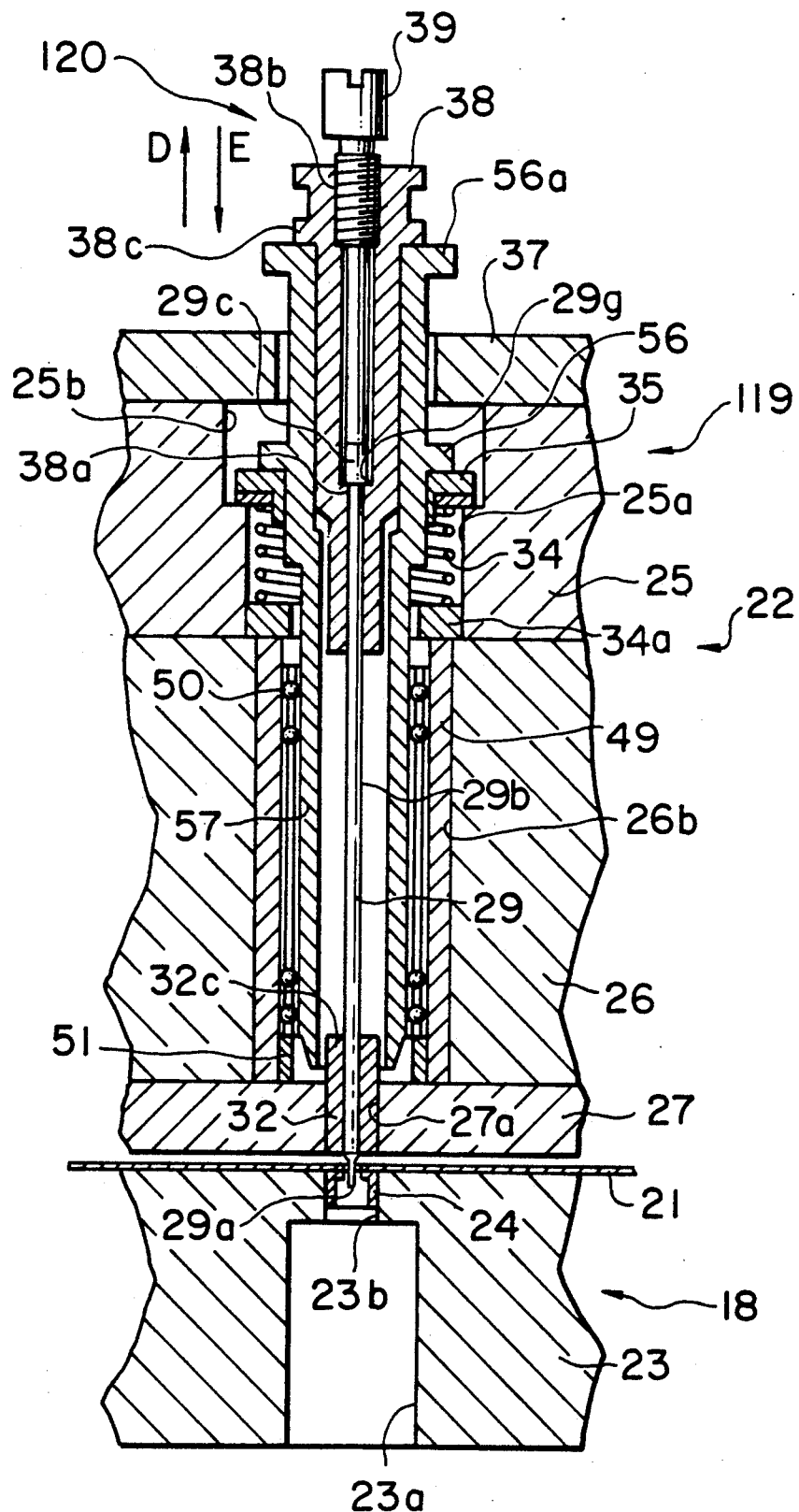
FIG. 7 is a sectional view showing main portions of a punching apparatus according to a third embodiment of the invention.
Figure 8:
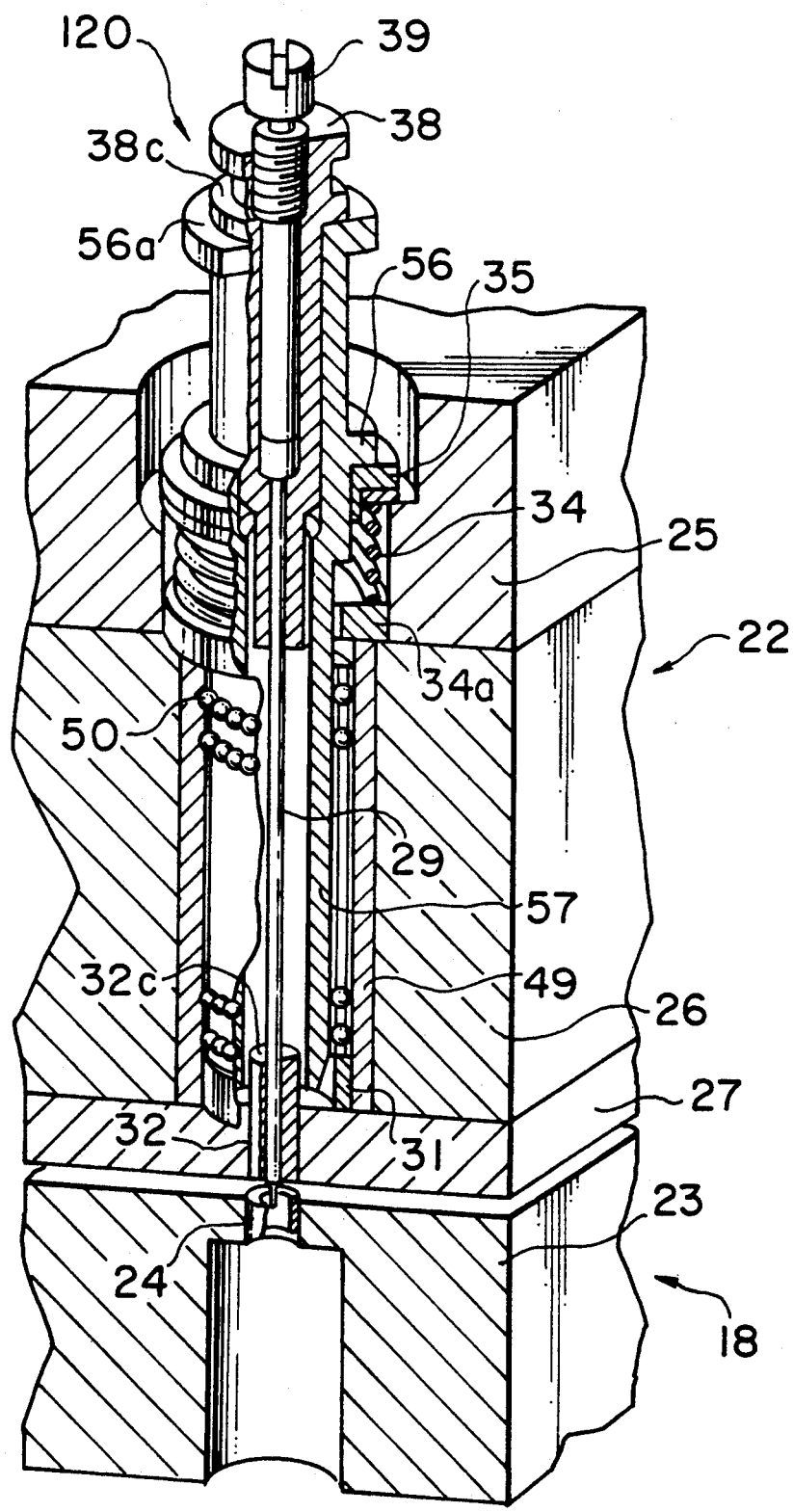
FIG. 8 is a partly sectional oblique view showing main portions of the punching apparatus of FIG. 7.

Next, description will be given of the construction of a punching apparatus 120 according to a third embodiment of the invention with reference to FIGS. 7 and 8. In the punching apparatus 120, the same or similar members or elements as those of the punching apparatus 20 are designated by the same reference numerals.

A sleeve 49 is disposed in each of the penetrating holes 26b of the punch pin support 26, and a ball guide 50 as high speed movement guide means is inserted in the sleeve 49. Under the ball guide 50, a ball guide stopper 51 is fixedly inserted in the sleeve 49.

The guide bush 32 is formed to have an inside diameter smaller than that of the ball guide 50 and fixedly disposed in the hole 27a of the stripper plate 27 with its upper end portion 32c projecting out upwards from the upper surface of the stripper plate 27.

In each of the penetrating holes 25a of the base plate 25, a spring shoe 34a is inserted so as to be kept in contact with the punch pin support 26 and, further, a spring 34 is inserted such as to be kept in contact with the spring shoe 34a.

Furthermore, in a large-diameter portion 25b of the penetrating hole 25a of the base plate 25, a spring shoe 35 is inserted such as to be kept in contact with the spring 34. A pin holder 57 formed with a flange 56 which is made to contact with the spring shoe 35 is inserted in the ball guide 50 such as to be movable in the directions D and E. The movement of the pin holder 57 in the direction D is limited by the stopper plate 37 fixed to the plate 25.

The large-diameter portion 29c at the top end of the punch pin 29 is fixed by means of the screw 39 screwed in the thread portion 38b of the sleeve 38 in such a manner that the shoulder portion 29g is brought into contact with the stepped portion 38a of the sleeve 38. The sleeve 38 is inserted in the upper portion of the pin holder 57 in such a manner that a large-diameter top end portion 38c thereof is put on an upper end 56a of the holder 57.

In the working section 119 of the punching apparatus 120 of the above construction, the punch pin 29 is moved in the axial direction due to linkage with the electromagnetic coil and the driving shaft (not shown) driven by the electromagnetic coil which are similar to those of the punching apparatus 20 of FIG. 1, for example, thereby performing the punching work.

Next, operation of the punching apparatus 120 of this embodiment will be further described.

First, the apparatus 120 is set in a sucking state where a negative pressure is applied to the penetrating holes 23a of the die base 23 so that the punching waste or chip from the green sheet 21 can be sucked when the chip is generated upon forming or making holes in the green sheet 21.

At the start, the electromagnetic coils, which are not shown, are energized so as to cause the driving shafts (not shown) to move in the axial direction. In linkage with the driving shafts, the punch pins 29 are moved in the direction E under the guidance of the ball guides 50 and due to the sliding along the guide bushes 32 until the cutting edges 29a of the punch pins 29 penetrate through the green sheet 21 as shown in FIG. 7.

Subsequently, the electromagnetic coils are deenergized so that the punch pins 29 which have penetrated through the green sheet 21 are drawn out due to the expanding force of the compression springs 34 so as to be restored to their initial state. By repeating the above operation, it is possible to make a desired number of through holes 21a in the green sheet 21 at fixed pitch.

In this case, in the punching apparatus 120, since the inside diameter of the guide bush 32 is smaller than that of the ball guide 50, the area of the sliding portion along which the punch pin 29 slides when it is moved can be reduced. In consequence, since the sliding resistance of the punch pin 29 can be reduced, it is possible to move the punch pin 29 at high speed.

Further, since the upper end 32c of the guide bush 32 projects out from the upper surface of the stripper plate 27, it is possible to prevent the lubricating oil of the ball guide 50 from leaking out to be depleted or drained, resulting in that the punch pin 29 can be moved at high speed with reliability.

Moreover, according to the punching apparatus 120 of this embodiment, since the punch pin 29 is so guided by the ball guide 50 as to be able to move in the axial direction at high speed and since the shaft portion 29b of the punch pin 29 adjacent to the cutting edge 29a is slidably fitted in the guide bush 32, the position of the punch pin 29 can be decided only by the guide bush 32. It is therefore possible to improve the accuracy of positioning of the punch pin 29 by increasing the accuracy of finishing of the guide bush 32.

In addition, since the horizontal position of the shaft portion 29b of the punch pin 29 adjacent to the cutting edge 29a is defined by the guide bush 32, it is possible to improve the point accuracy of the edge 29a of the punch pin 29.

Figure 9:
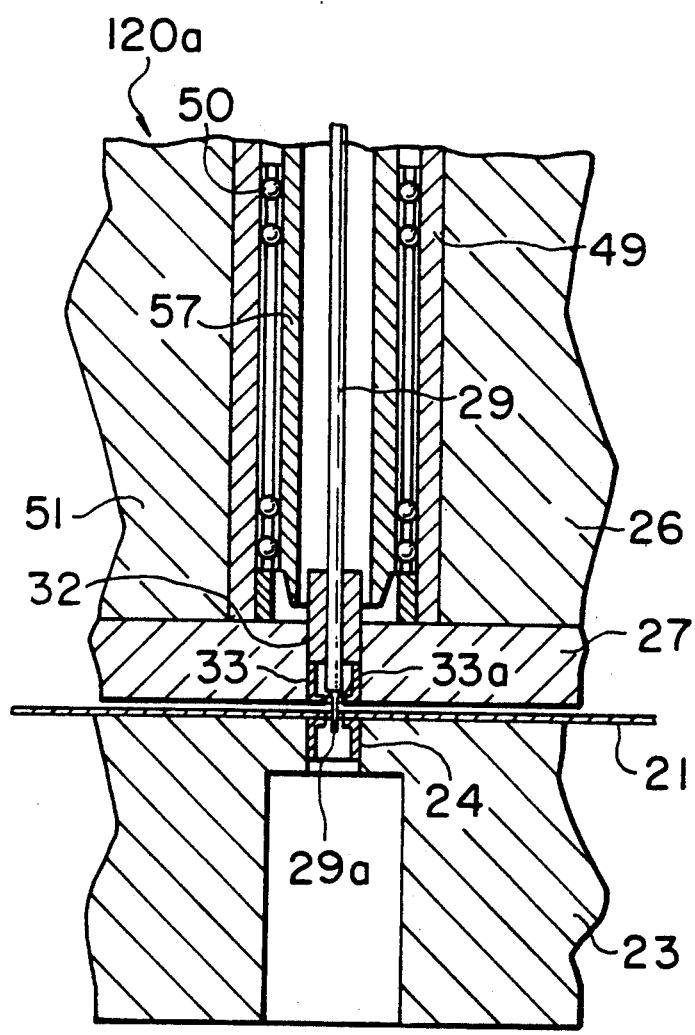
FIG. 9 is a sectional view showing main portions of a punching apparatus according to a fourth embodiment of the invention.
Figure 10:
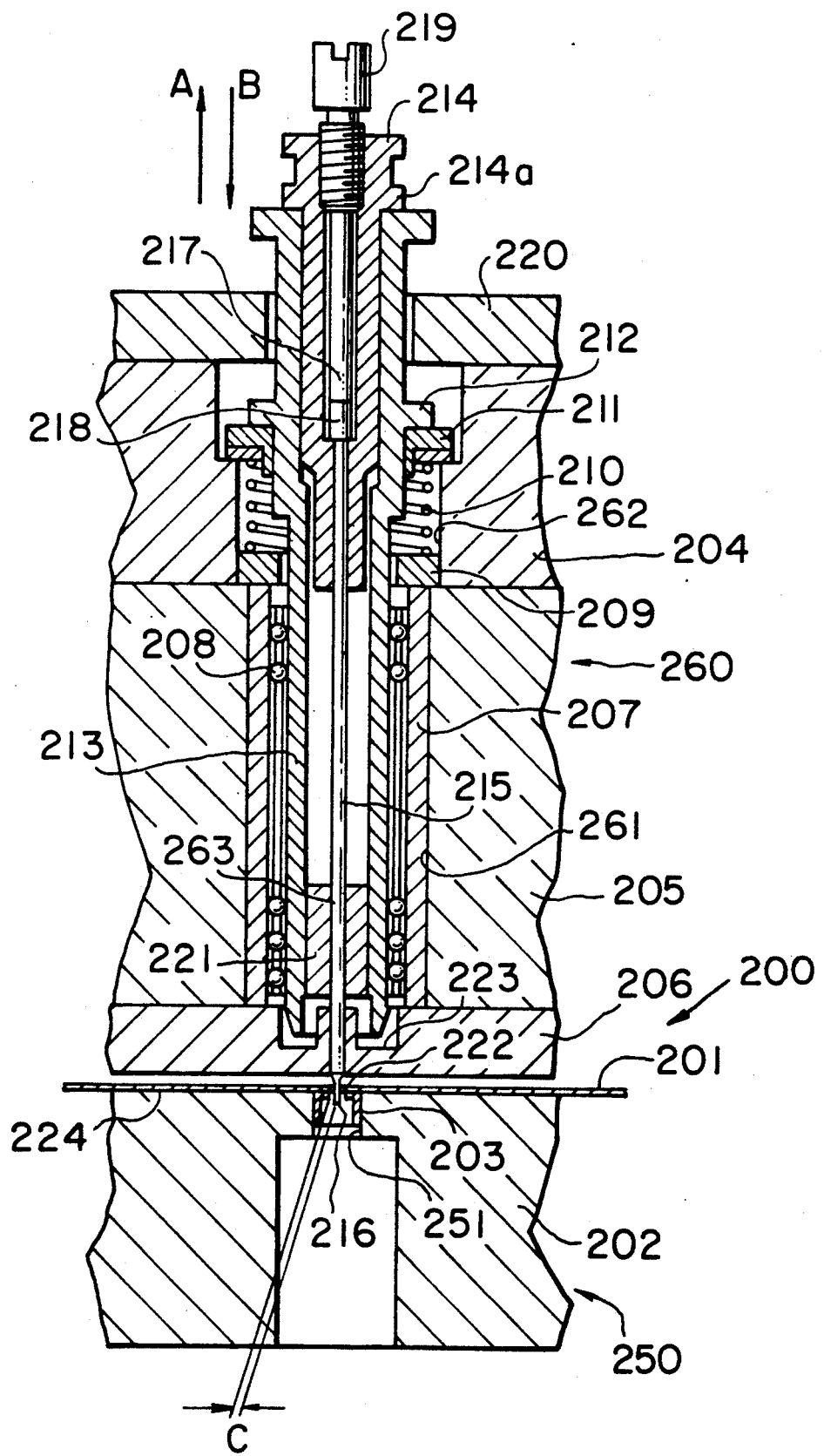
FIG. 10 is a sectional view showing essential portions of a punching apparatus (not known in public) which has been used in one of the inventors' companies while being kept secret or confidential from outside.

FIG. 9 is a sectional view showing essential or main portions of a punching apparatus 120a according to a fourth embodiment of the present invention.

The punching apparatus of this embodiment is the punching apparatus 120a having almost the same or similar construction as that of the punching apparatus 120 of the third embodiment and serving to make holes in the green sheet 21. A point of difference from the punching apparatus 120 of the third embodiment is that the stripper chamber-forming member 33, which is formed with the penetrating hole 33a of a little larger diameter than the cutting edge 29a of the punch pin 29 in a position thereof adjacent to the die 24, is fixed to the underside of the guide bush 32 so as to be opposed to the die 24 as shown in FIG. 9.

In consequence, in the working section of the punching apparatus 120a of this embodiment as well, the punch pin 29 can be moved at high speed due to reduction of the sliding resistance thereof and the accuracy of positioning of the punch pin 29 and its end portion adjacent to the cutting edge 29a can be improved, equally to the working section of the punching apparatus 120 of the third embodiment.

Further, since the stripper chamber-forming member 33 is disposed under the guide bush 32, lift of the green sheet 21 at the moment when the punch pin 29 is drawn out, that is, lift of the green sheet 21 at the portion thereof around the hole 21a due to frictional rubbing against the cutting edge 29a of the punch pin 29, can be suppressed. It is therefore possible to prevent expansion and deformation of the green sheet 21 as well as enlargement and deformation of the hole 21a.

As seen from the above description, according to the punching apparatus of the present invention, since it is possible to improve the accuracy of positioning as well as to reduce the sliding resistance of the punch pin, it becomes possible to move the punch pin at high speed with high accuracy.

Although the invention made by the present inventors has been described concretely in terms of specific embodiments, the present invention is not limited to the above-described embodiments but can be modified in various manner, of course, without exceeding the scope of the claimed invention.

What is claimed is:

1. A punching apparatus comprising:
   a lower die block having a flat upper surface on which a sheet-like matter to be worked is to be put and at least one first penetrating hole therein extending from said upper surface perpendicularly thereto and located in a position where a hole is to be made in the matter to be worked;
   an upper die block, stationary relative to the lower die block, having a lower surface arranged close to the upper surface of the lower die block so as to be opposed to said upper surface and at least one second penetrating hole therein extending from said lower surface perpendicularly thereto and located in a position opposite to an opening at the upper end of the first penetrating hole; and at least one punch pin having a shaft portion and a cutting edge portion of smaller diameter than the shaft portion located at the lower end of said shaft portion and inserted in said second penetrating hole movably along said second penetrating hole so as to project said cutting edge portion out from said second penetrating hole of the upper die block, wherein said upper die block has upper and lower guide portions located in positions adjacent to upper and lower ends of the second penetrating hole for serving to support the shaft portion of the punch pin along a sliding surface for free sliding movement along the second penetrating hole, the upper and lower guide portions defining a two-dimensional position of the punch pin in the lower surface of the upper die block;

a fluid passage means through which a gaseous fluid is made to flow downward along the sliding surface over which the lower guide portion and the shaft portion of the punch pin slide against each other, wherein said fluid passage means comprises a fluid induction hole formed in the upper due block for serving to introduce the fluid into the second penetrating hole at an intermediate position between the upper and lower guide portions of the upper die block, and a lower fluid passage formed between the lower guide portion and the shaft portion of the punch pin along the sliding surface over which the lower guide portion and the shaft portion of the punch pin slide against each other, wherein the lower fluid passage comprises a grooved portion formed in the lower guide portion along the sliding surface over which the shaft portion of the punch pin slides.

2. A punching apparatus according to claim 1, wherein the grooved portion formed in the lower guide portion along the sliding surface is spiral.

3. A punching apparatus comprising:

a lower die block having a flat upper surface on which a sheet-like matter to be worked is to be put and at least one first penetrating hole therein extending from said upper surface perpendicularly thereto and located in a position where a hole is to be made in the matter to be worked;

an upper die block, stationary relative to the lower die block, having a lower surface arranged close to the upper surface of the lower die block so as to be opposed to said upper surface and at least one second penetrating hole therein extending from said lower surface perpendicularly thereto and located in a position opposite to an opening at the upper end of the first penetrating hole; and at least one punch pin having a shaft portion and a cutting edge portion of smaller diameter than the shaft portion located at the lower end of said shaft portion and inserted in said second penetrating hole movably along said second penetrating hole so as to project said cutting edge portion out from said second penetrating hole of the upper die block, wherein said upper die block has upper and lower guide portions located in positions adjacent to upper and lower ends of the second penetrating hole for serving to support the shaft portion of the punch pin along a sliding surface for free sliding movement along the second penetrating hole, the upper and lower guide portions defining a two-dimensional position of the punch pin in the lower surface of the upper die block;

a fluid passage means through which a gaseous fluid is made to flow downward along the sliding surface over which the lower guide portion and the shaft portion of the punch pin slide against each other, wherein said fluid passage means comprises a fluid induction hole formed in the upper due block for serving to introduce the fluid into the second penetrating hole at an intermediate position between the upper and lower guide portions of the upper die block, and a lower fluid passage formed between the lower guide portion and the shaft portion of the punch pin along the sliding surface over which the lower guide portion and the shaft portion of the punch pin slide against each other, wherein the grooved portion formed in the lower guide portion along the sliding surface comprises a flattened portion formed in the shaft portion of the punch pin along the sliding surface over which the lower guide portion slides.

4. A punching apparatus according to claim 3, wherein the flattened portion is spiral.

5. A punching apparatus comprising:

a lower die block having a flat upper surface on which a sheet-like matter to be worked is to be put and at least one first penetrating hole therein extending from said upper surface perpendicularly thereto and located in a position where a hole is to be made in the matter to be worked;

an upper die block, stationary relative to the lower die block, having a lower surface arranged close to the upper surface of the lower die block so as to be opposed to said upper surface and at least one second penetrating hole therein extending from said lower surface perpendicularly thereto and located in a position opposite to an opening at the upper end of the first penetrating hole; and at least one punch pin having a shaft portion and a cutting edge portion of smaller diameter than the shaft portion located at the lower end of said shaft portion and inserted in said second penetrating hole movably along said second penetrating hole so as to project said cutting edge portion out from said second penetrating hole of the upper die block, wherein said upper die block has upper and lower guide portions located in positions adjacent to upper and lower ends of the second penetrating hole for serving to support the shaft portion of the punch pin along a sliding surface for free sliding movement along the second penetrating hole, the upper and lower guide portions defining a two-dimensional position of the punch pin in the lower surface of the upper die block;

a fluid passage means through which a gaseous fluid is made to flow downward along the sliding surface over which the lower guide portion and the shaft portion of the punch pin slide against each other, wherein said fluid passage means comprises a fluid induction hole formed in the upper due block for serving to introduce the fluid into the second penetrating hole at an intermediate position between the upper and lower guide portions of the upper die block, and a lower fluid passage formed between the lower guide portion and the shaft portion of the punch pin along the sliding surface over which the lower guide portion and the shaft portion of the punch pin slide against each other, wherein the lower fluid passage comprises a grooved portion formed in the shaft portion of the punch pin along the sliding surface over which the lower guide portion slides.

6. A punching apparatus comprising:

a lower die block having a flat upper surface on which a sheet-like matter to be worked is to be put and at least one first penetrating hole therein extending from said upper surface perpendicularly thereto and located in a position where a hole is to be made in the matter to be worked;

an upper die block, stationary relative to the lower die block, having a lower surface arranged close to the upper surface of the lower die block so as to be opposed to said upper surface and at least one second penetrating hole therein extending from said lower surface perpendicularly thereto and located in a position opposite to an opening at the upper end of the first penetrating hole; and, at least one punch pin having a shaft portion and a cutting edge portion of smaller diameter than the shaft portion located at the lower end of said shaft portion and inserted in said second penetrating hole movably along said second penetrating hole so as to project said cutting edge portion out from said second penetrating hole of the upper die block, wherein said upper die block has upper and lower guide portions located in positions adjacent to upper and lower ends of the second penetrating hole for serving to support the shaft portion of the punch pin along a sliding surface for free sliding movement along the second penetrating hole, the upper and lower guide portions defining a two-dimensional position of the punch pin in the lower surface of the upper die block;

a fluid passage means through which a gaseous fluid is made to flow downward along the sliding surface over which the lower guide portion and the shaft portion of the punch pin slide against each other, wherein the lower guide is formed above the lower end of the second penetrating hole, and the upper die block further has a plenum chamber-forming means at the lower end of the second penetrating hole, the plenum chamber-forming means projecting radially inwardly so as to form a plenum chamber in a portion between the lower end of the lower guide portion and the lower end of the second penetrating hole and serving to throttle the flow of the fluid passing through the lower end of the second penetrating hole.

7. A punching apparatus comprising:

a lower die block having a flat upper surface on which a sheet-like matter to be worked is to be put and at least one first penetrating hole therein extending from said upper surface perpendicularly thereto and located in a position where a hole is to be made in the matter to be worked;

an upper die block, stationary relative to the lower die block, having a lower surface arranged close to the upper surface of the lower die block so as to be opposed to said upper surface and at least one second penetrating hole therein extending from said lower surface perpendicularly thereto and located in a position opposite to an opening at the upper end of the first penetrating hole;

at least one punch pin having a shaft portion and a cutting edge portion of smaller diameter than the shaft portion located at the lower end of said shaft portion and inserted in said second penetrating hole movably along said second penetrating hole so as to project said cutting edge portion out from said second penetrating hole of the upper die block, wherein said upper die block has upper and lower guide portions located in positions adjacent to upper and lower ends of the second penetrating hole for serving to support the shaft portion of the punch pin along a sliding surface for free sliding movement along the second penetrating hole, the upper and lower guide portions defining a two-dimensional position of the punch pin in the lower surface of the upper die block, and wherein the upper die block comprises an upper die body which includes an upper die central portion having therein a central penetrating hole portion constituting an axial central part of the second penetrating hole, an upper plate portion having therein an upper penetrating hole portion constituting an axial upper part of the second penetrating hole and fixed to the upper die central portion, and a lower plate portion having therein a lower penetrating hole portion constituting an axial lower part of the second penetrating hole and fixed to the upper die central portion, an upper guide member disposed and fixed to the upper penetrating hole portion of the upper plate portion for serving to constitute the upper guide portion, and a lower guide member disposed and fixed to the lower penetrating hole portion of the lower plate portion for serving to constitute the lower guide portion.

8. A punching apparatus comprising:

a lower die block having a flat upper surface on which a sheet-like matter to be worked is to be put and at least one first penetrating hole therein extending from said upper surface perpendicularly thereto and located in a position where a hole is to be made in the matter to be worked;

an upper die block, stationary relative to the lower die block, having a lower surface arranged close to the upper surface of the lower die block so as to be opposed to said upper surface and at least one second penetrating hole therein extending from said lower surface perpendicularly thereto and located in a position opposite to an opening at the upper end of the first penetrating hole;

at least one punch pin having a shaft portion of smaller diameter than the second penetrating hole and a cutting edge portion of smaller diameter than the shaft portion located at the lower end of said shaft portion, and inserted in said second penetrating hole movably along said second penetrating hole so as to project said cutting edge portion out from said second penetrating hole of the upper die block; and a high speed guide means disposed in an axial central part of the second penetrating hole between the second penetrating hole and the shaft portion of the punch pin for serving to guide the punch pin in such a manner that the punch pin can be moved at high speed along the second penetrating hole, said high speed guide means comprising a ball guide having balls adapted to be contacted with a wall of the second penetrating hole and with a circumference of the shaft portion of the punch pin and to be rolled over the wall of the second penetrating hole at a radially outer side of the ball guide and the circumference of the shaft portion of the punch pin at a radially inner side of the ball guide when the punch pin is moved axially, wherein said upper die block has a guide portion in a position adjacent to the lower end of the second penetrating hole so as to guide the shaft portion of the punch pin for free sliding movement along the second penetrating hole.

9. A punching apparatus according to claim 8, wherein said upper die block comprises an upper die body having said second penetrating hole and a guide bush disposed between the second penetrating hole and the shaft portion of the punch pin in the position adjacent to the lower end of the second penetrating hole and fixed to the upper die block so as to constitute said guide portion, the guide bush serving to guide the shaft portion of the punch pin for free sliding movement along the second penetrating hole.

10. A punching apparatus according to claim 9, wherein said upper die block comprises an upper die central portion having therein a central penetrating hole portion constituting an axial central part of the second penetrating hole, an upper plate portion having therein an upper penetrating hole portion constituting an axial upper part of the second penetrating hole and fixed to the upper die central portion, and a lower plate portion having therein a lower penetrating hole portion constituting an axial lower part of the second penetrating hole and fixed to the upper die central portion, the diameter of said lower penetrating hole portion being smaller than that of the central penetrating hole portion, and said guide bush is inserted in and fixed to the lower penetrating hole portion.

11. A punching apparatus according to claim 10, wherein an inside diameter of the guide bush is smaller than that of the ball guide.

12. A punching apparatus according to claim 10, wherein the upper end of the guide bush projects out upwards from the upper surface of the lower plate portion.

13. A punching apparatus according to claim 8, wherein the guide portion is formed above the lower end of the second penetrating hole, and the upper die block has a flange portion at the lower end of the second penetrating hole, the flange portion projecting radially inwardly of said second penetrating hole, and a hole portion defined by the radially inward end of the flange portion having a diameter smaller than that of the shaft portion of the punch pin but greater than that of the cutting edge portion.

14. A punching apparatus comprising:
a lower die block having a flat upper surface on which a sheet-like matter to be worked is to be put and plural first penetrating holes therein extending from said upper surface perpendicularly thereto and located in positions where holes are to be made in the matter to be worked;
an upper die block, stationary relative to the lower die block, having a lower surface arranged close to the upper surface of the lower die block so as to be opposed to said upper surface and plural second penetrating holes therein extending from said lower surface perpendicularly thereto and located in positions opposite to openings at the upper ends of the first penetrating holes; and
plural punch pins, each having a shaft portion and a cutting edge portion of smaller diameter than the shaft portion located at the lower end of said shaft portion and inserted in associated one of said second penetrating holes movably along the one of said second penetrating holes so as to project said cutting edge portion out from the one of said second penetrating holes of the upper die block,
wherein said upper die block has plural sets of upper and lower guide portions each set being located in positions adjacent to upper and lower ends of an associated one of the second penetrating hole for serving to support the shaft portion of an associated one of the punch pin for free sliding movement along the one of the second penetrating holes, the lower guide portion defining a two-dimensional position of the one of the punch pins in the lower surface of the upper die block, and
wherein said punching apparatus further comprising means for actuating each punch pin independently of the other punch pins to move axially for making a hole in the sheet-like matter at a corresponding position thereof.

15. A punching apparatus according to claim 14, further comprising a fluid passage means through which a gaseous fluid is made to flow downward along the sliding surface over which the lower guide portion and the shaft portion of the punch pin slide against each other.

16. A punching apparatus according to claim 15, wherein said fluid passage means comprises a fluid induction hole formed in the upper die block for serving to introduce the fluid into the second penetrating hole at an intermediate position between the upper and lower guide portions of the upper die block, and a lower fluid passage formed between the lower guide portion and the shaft portion of the punch pin along the sliding surface over which the lower guide portion and the shaft portion of the punch pin slide against each other.

17. A punching apparatus according to claim 15, wherein the punch pin and the guide portion are formed by sinters.

18. A punching apparatus according to claim 17, wherein the sinter is made of cemented carbide or carbides.

19. A punching apparatus according to claim 17, wherein the sinter is that of fine ceramics.

20. A punching apparatus according to claim 15, wherein the punch pin and the guide portion are formed by sinters of the same material.

21. A punching apparatus according to claim 20, wherein the sinter is made of cemented carbide or carbides.

22. A punching apparatus according to claim 15, wherein the punch pin and the guide portion are formed by sinters of different materials.

23. A punching apparatus according to claim 14, wherein said punching apparatus comprises means for punching a ceramic green sheet, and the sheet-like matter to be worked consists essentially of the ceramic green sheet.

* * * * *

UNITED STATES PATENT AND TRADEMARK OFFICE
CERTIFICATE OF CORRECTION

PATENT NO. : 5,214,991

DATED : June 1, 1993

INVENTOR(S) : Izumi Shimizu, et al.

It is certified that error appears in the above-identified patent and that said Letters Patent is hereby corrected as shown below:

Claim 3, column 16, line 12, delete "due" and substitute therefor --die--.

Claim 5, column 16, line 65, delete "due" and substitute therefor --die--.

Claim 8, column 18, line 56, delete "said" and substitute therefor --the--.

Claim 14, column 20, line 16, delete "hole" and substitute therefor --holes--.

Signed and Sealed this

Twenty-first Day of December, 1993

Attest:

BRUCE LEHMAN

*Attesting Officer*     *Commissioner of Patents and Trademarks*